United States Patent [19]

Whatley

[11] Patent Number: 4,482,868
[45] Date of Patent: Nov. 13, 1984

[54] OUTPUT STAGE FOR A DRIVER CIRCUIT HAVING LOW QUIESCENT OUTPUT CURRENT

[75] Inventor: Roger A. Whatley, Austin, Tex.

[73] Assignee: Motorola, Inc., Schaumburg, Ill.

[21] Appl. No.: 472,516

[22] Filed: Mar. 7, 1983

[51] Int. Cl.³ ............................ H03F 3/26; H03F 3/16
[52] U.S. Cl. ..................................... 330/274; 330/268; 330/277; 330/300
[58] Field of Search ................ 330/268, 274, 277, 300

[56] References Cited
U.S. PATENT DOCUMENTS
4,336,503 6/1982 Whatley .......................... 330/268 X Primary Examiner—James B. Mullins
Assistant Examiner—Steven J. Mottola
Attorney, Agent, or Firm—Anthony J. Sarli, Jr.; Jeffrey Van Myers; Robert L. King

[57] ABSTRACT

An output stage having a small quiescent current is provided. A current source portion provides an output current via an output terminal in proportion to a drive current. A current sink portion sinks output current in proportion to an input control voltage. A cross-over distortion portion and a shunt portion are coupled to the current source portion to minimize output quiescent current in proportion to the input control voltage.

8 Claims, 2 Drawing Figures (a)

(b)

OUTPUT STAGE FOR A DRIVER CIRCUIT HAVING LOW QUIESCENT OUTPUT CURRENT

TECHNICAL FIELD

This invention relates generally to driver circuits and, more particularly, to a driver circuit having low quiescent output current when used with an operational amplifier.

BACKGROUND ART

Typically, driver circuits are utilized with an operational amplifier which provides an output signal varying between a positive supply voltage $V_{DD}$ and a negative supply voltage $V_{SS}$ relative to an intermediate analog ground voltage potential $V_{AG}$. In an attempt to reduce power dissipation, CMOS operational amplifiers may be designed for Class B operation where two output devices are nonconductive simultaneously when the output signal is near analog ground. However, severe cross-over distortion exists in class B operation when the output crosses the $V_{AG}$ potential in either direction. Therefore, Class AB operation is frequently more desirable. In Class AB operation, two output devices are simultaneously conductive when the output signal is near analog ground. Class AB operation minimizes cross-over distortion which is characteristic of Class B operation. However, circuits which reduce cross-over distortion may minimize the distortion at the expense of excessive quiescent DC current resulting from the simultaneous operation of the output devices at positive or negative voltages anywhere close to $V_{AG}$. Therefore, both output devices must be restricted to be jointly conductive only when the output signal is within a minimum threshold voltage of $V_{AG}$. Such a circuit is described in U.S. Pat. No. 4,336,503 which is assigned to the same assignee as the instant application. However, such a circuit must be carefully designed to prevent oscillation as noted therein. Other known circuits which attempt to minimize cross-over distortion either have excessive quiescent output current or introduce undesirable design limitations.

SUMMARY OF THE INVENTION

Accordingly, an object of the present invention is to provide an improved output stage for a driver circuit.

Another object of the present invention is to provide an output stage which minimizes both cross-over distortion and quiescent output current.

Yet another object of the present invention is to provide an improved output driver circuit having low quiescent output current for all DC conditions.

In carrying out the above and other objects and advantages of the present invention, there is provided, in one form, an output stage for a driver circuit having current source means for providing an output current via an output terminal. The output current is proportional to a drive current provided by a drive means. A current sink means is coupled to the current source means for sinking output current in proportion to an input control voltage. Cross-over compensation means for biasing the current source means at least a predetermined bias voltage above the output terminal. Shunt means are coupled to the drive means, the current source means and the cross-over compensation means for shunting drive current away from the current source means in response to the input control voltage. The shunt means provide for low quiescent output current and introduce no undesirable effects into the output stage.

The above and other objects, features and advantages of the present invention will be more clearly understood from the following detailed description taken in conjunction with the accompanying drawing.

BRIEF DESCRIPTION OF THE INVENTION

Figure 1:
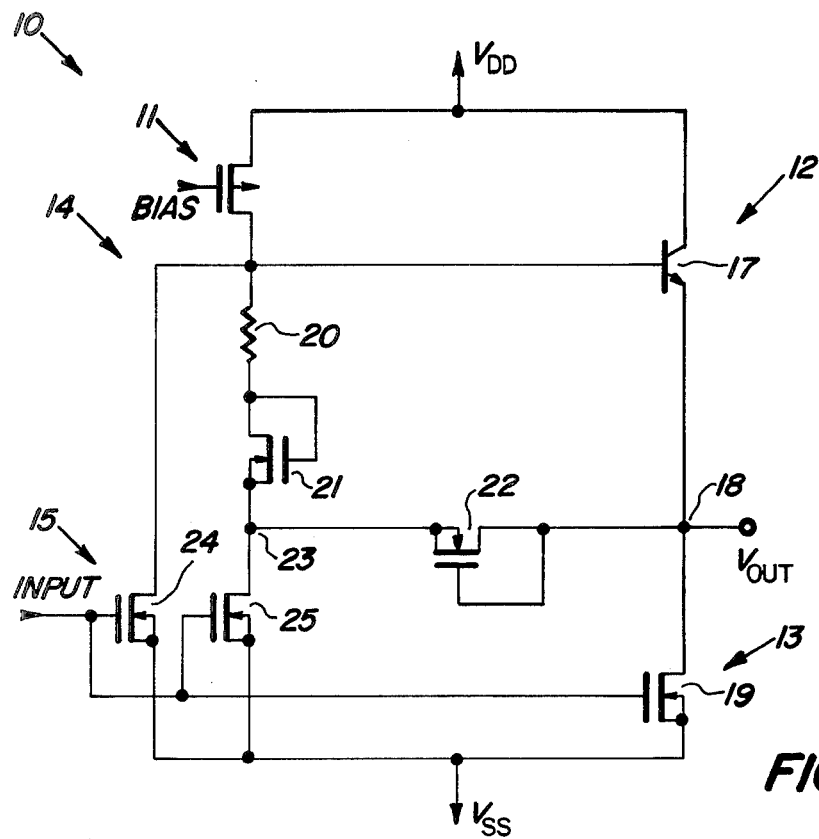
FIG. 1 illustrates in schematic diagram form an output stage for a driver circuit constructed in accordance with a preferred embodiment of the present invention.

Shown in the single drawing is an output stage 10 constructed in accordance with the preferred embodiment of the present invention. Output stage 10 comprises generally drive means 11, current source means 12, current sink means 13, cross-over compensation means 14 and shunt means 15. It should readily be understood that the present invention may be practiced using any of numerous types of drive means, current source and current sink means such as either a transistor or a resistor. For purposes of illustration, the type of drive means, current source and current sink is irrelevant. Further, although output stage 10 may be coupled to an operational amplifier, an operational amplifier is not shown since numerous other uses of the present invention exist. While specific N-channel and P-channel MOS devices are generally shown, it should be clear that output stage 10 could be implemented by completely reversing the processing techniques (e.g. N-channel to P-channel) or by using other types of transistors.

Drive means 11 have a first terminal coupled to a supply voltage $V_{DD}$, which is typically positive with respect to an output voltage, and a second terminal. Current source means 12 comprise a bipolar transistor 17 having a collector electrode coupled to the supply voltage $V_{DD}$, a base electrode coupled to the second terminal of drive means 11, and an emitter electrode coupled to an output terminal 18. Current sink means 13 comprise an N-channel MOS transistor 19 having a drain electrode coupled to output terminal 18, a gate electrode coupled to an input control signal, and a source electrode coupled to a supply voltage $V_{SS}$ which is typically negative with respect to the output voltage.

Cross-over compensation means 14 comprise a resistor 20 having a first terminal coupled to the second terminal of drive means 11. A second terminal of resistor 20 is coupled to both a drain electrode and a gate electrode of an N-channel transistor 21 which is diode connected. A source electrode of transistor 21 is coupled to a source electrode of an N-channel transistor 22 at a node 23. Transistor 22 is diode connected by having both a gate electrode and a drain electrode coupled to output terminal 18.

Shunt means 15 comprise an N-channel transistor 24 having a drain electrode coupled to the base electrode of transistor 17, a gate electrode coupled to the input control signal and a source electrode coupled to a supply voltage $V_{SS}$. An N-channel transistor 25 has a drain electrode coupled to the source electrode of transistor 21, a gate electrode coupled to the input control voltage, and a source electrode coupled to supply voltage $V_{SS}$.

In a preferred form, each source electrode of N-channel transistors 19, 21, 22, 24 and 25 is coupled to the respective substrate thereof. Although the present invention may be practiced without connecting the source electrode and substrate of each of these transistors, the threshold voltage of each transistor connected in this manner is effectively lowered. Therefore, a lower voltage is required to make N-channel transistors 19, 21, 22, 23 and 24 conductive which allows for a larger voltage operation. Further, in a preferred embodiment drive means 11 is a P-channel MOS transistor having a source electrode coupled to the $V_{DD}$ supply voltage, a control electrode coupled to a bias voltage, and a drain electrode coupled to the base electrode of transistor 17.

In operation, transistor 19 functions as a voltage controlled current sink which sinks current from a load (not shown) which may be coupled to output terminal 18. The amount of current which transistor 19 sinks is controlled by the input control voltage. Transistor 17 functions as a current controlled current source which sources current to the load (not shown). The amount of current transistor 17 sources is controlled by the amount of drive current applied to the base electrode thereof by drive means 11. Simultanouesly, transistors 24 and 25 of shunt means 15 shunt the drive current away from the base electrode of transistor 17 in proportion to the input control voltage. Transistors 17 and 19 are biased so that both transistors conduct a predetermined minimal amount of current when the voltage potential at output terminal 18 is near mid-supply range between $V_{DD}$ and $V_{SS}$.

In the illustrated embodiment, supply voltages $V_{DD}$ and $V_{SS}$, respectively, are applied to driver circuit 10. Assume that the voltage potential which is substantially one-half between $V_{DD}$ and $V_{SS}$ is an analog ground voltage, $V_{AG}$. For the purpose of illustration only, assume that the voltage at output terminal 18 is initially substantially above $V_{AG}$ and that the input control voltage is greater than the supply voltage $V_{SS}$. In response to a high gate voltage, transistors 19, 24 and 25 will conduct thereby pulling the voltage potential on each drain electrode thereof toward $V_{SS}$. If drive means 11 provide less current than transistors 24 and 25 are capable of conducting with such an input control voltage, the voltage at node 23 will decrease until diode connected transistor 22 becomes forward biased. At that time, transistor 25 will sink whatever current from output terminal 18 is necessary to maintain the voltage at node 23 one $V_{GS}$ below the output voltage. The net result of transistors 19 and 24 conducting current is to quickly pull the output voltage toward $V_{SS}$.

If the input control voltage begins to approach $V_{SS}$, the current flowing through transistors 24, 25 and 19 is reduced and the output voltage will begin to increase from substantially $V_{SS}$. When the current shunted by transistors 24 and 25 is reduced to the amount of current provided by drive means 11, the voltage at node 23 becomes sufficient to substantially turn off transistor 22 since the voltage at node 23 is less than one $V_{GS}$ below the output voltage. Transistor 21 and resistor 20 are provided so that the voltage drop across the series combination is approximately equal to the sum of the $V_{BE}$ of transistor 17 and the $V_{GS}$ of transistor 22. This means that the voltage at the base of transistor 17 is very close to the voltage necessary to make transistor 17 conductive. As the output voltage continues to increase and transistor 25 continues to shunt less current, the voltage on the base electrode of transistor 17 continues to increase. As soon as the voltage potential at the base electrode of transistor 36 is one $V_{BE}$ above the output voltage, transistor 17 begins to conduct and source a load current to continue to increase the output voltage toward $V_{DD}$.

The illustrated embodiment differs from prior art circuits in that when the output voltage begins to drop to $V_{SS}$, shunt transistor 24 shunts a predetermined amount of current from the base electrode of transistor 17 to prevent transistor 17 from turning on and thereby sourcing a large quiescent output current. The device sizes of transistors 24 and 25 may be ratioed to each other so that each transistor sinks a fixed ratio of current from the base electrode of transistor 17.

Assume now that the voltage at output terminal 18 is initially well below $V_{AG}$ and the input control voltage is less than a threshold voltage greater than $V_{SS}$. Therefore transistors 19, 24 and 25 are made nonconductive. All of the drive current provided by drive means 11 is coupled to the base electrode of transistor 17 and transistor 17 is turned on. As transistor 17 sources a large output current, the output voltage at terminal 18 rapidly increases.

However, assume that the output voltage is initially close to $V_{SS}$ potential, and the input control voltage decreases from above a threshold voltage greater than $V_{SS}$ to below the threshold voltage. Therefore, transistors 19, 24 and 25 are made nonconductive. The voltage potential at both node 23 and the output voltage increases from $V_{SS}$ toward $V_{DD}$. The voltage potential at the base electrode of transistor 17 is fixed at the sum of the voltage across resistor 20 and transistor 21 with respect to the voltage at node 23. This voltage drop is substantially equal to the sum of the $V_{GS}$ of transistor 22 and the $V_{BE}$ of transistor 17. Therefore, the base electrode of transistor 17 is biased so that transistor 17 nearly turns on when the output voltage is approximately at $V_{AG}$. This creates a smooth transition of the output voltage around $V_{AG}$ which is commonly referred to as cross-over compensation.

Although in a preferred form resistor 20 has been included in cross-over compensation means 14, resistor 20 is not necessary to provide a reduced bias current to the base electrode of transistor 17. If resistor 20 is removed from the circuit, the device size of transistor 24 may be modified with respect to the device size of transistor 25 to insure a proper bias voltage for transistor 17 when the output voltage is near $V_{AG}$. In a preferred form, the device size of transistor 25 is substantially seven times greater than the device size of transistor 24. However, any ratio of the device sizes of transistors 24 and 25 may be used to minimize the quiescent output current.

Figure 2:
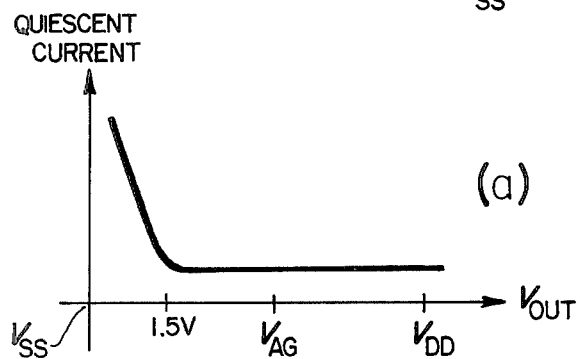
FIGS. 2 (a) and (b) illustrate in graphical form the advantages of the present invention with respect to quiescent output current.
Figure 2:
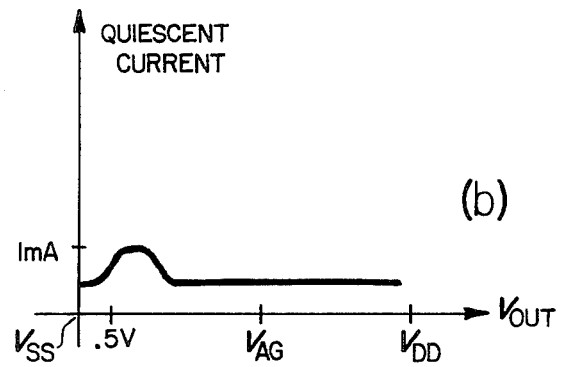

Shown in FIG. 2 (a) is a graph of the output quiescent current without transistor 24 coupled to driver circuit 10. As the output voltage decreases and approaches $V_{SS}$, the quiescent current increases dramatically. This is because diode-connected transistor 21 and resistor 20 clamp the base electrode of transistor 17 substantially above $V_{SS}$. As the output voltage further decreases toward $V_{SS}$, transistor 17 is biased on hard thereby sourcing a large amount of quiescent current.

Shown in FIG. 2 (b) is a graph of the output quiescent current with transistor 24. As the output voltage decreases, transistor 17 is not biased on hard because transistor 24 is shunting a predetermined portion of bias current away from transistor 17.

By now it should be appreciated that a driver circuit which minimizes output quiescent current has been provided. The successful operation of driver circuit 10 is not limited to a particular range of device sizes nor does the circuit introduce unwanted circuit problems.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. An output stage for a driver circuit which has a small amount of quiescent output current, comprising:
    current source means for sourcing output current via an output terminal in proportion to an applied drive current;
    current sink means for sinking output current via the output terminal in proportion to an input control voltage;
    drive means coupled to said current source means for providing the drive current;
    cross-over compensation means for biasing the current source means at least a predetermined bias voltage above the output terminal, comprising:
        a first diode-connected device having a first current electrode coupled to both said drive means and said current source means, and a second current electrode; and
        a second diode-connected device having a first current electrode coupled to the second current electrode of said first diode-connected device, and a second current electrode coupled to both said output terminal and said current sink means; and
    shunt means, for shunting the drive current away from the current source means in response to the input control voltage, comprising:
        first shunt means coupled in parallel with both the second diode-connected device and said current sink means; and
        second shunt means coupled in parallel with said first and second diode-connected devices and with said current sink means.

2. The output stage of claim 1 wherein said cross-over compensation means further comprise:
    a resistor having a first terminal coupled to both the current source means and to the drive means, and a second terminal coupled to said first diode-connected device.

3. The output stage of claim 2 wherein said first shunt means is a first transistor having a first current electrode coupled to both the second current electrode of the first diode-connected device and the second current electrode of said second diode-connected device, and a second current electrode coupled to said current sink means.

4. The output stage of claim 3 wherein said second shunt means is a second transistor having a first current electrode coupled to both said drive means and said current source, and a second current electrode coupled to both the second current electrode of the transistor of said first shunt means and said current sink means.

5. The output stage of claim 4 wherein said current source means is a third transistor having a first current electrode coupled to said drive means, a second current electrode coupled to said current sink means, and a control electrode coupled to said drive means, said cross-over compensation means, to said second shunt means.

6. The output stage of claim 5 wherein said current sink means is a fourth transistor having a first current electrode coupled to said output terminal, a control electrode coupled to said input control voltage, and a second current electrode coupled to second current electrodes of said first and second transistors.

7. An output stage comprising:
    an NPN bipolar transistor, for sourcing output current, having the collector thereof coupled to a first supply voltage terminal, the emitter thereof coupled to an output terminal, and a base electrode;
    a first MOS transistor of a first conductivity type, for sinking output current, having a first current electrode coupled to said output terminal, a second current electrode coupled to a second supply voltage terminal, and a control electrode coupled to a control signal;
    a second MOS transistor of a second conductivity type for supplying a drive current having a first current electrode coupled to said first supply voltage terminal, a control electrode coupled to a bias voltage, and a second current electrode coupled to the base electrode of said NPN bipolar transistor;
    a cross-over compensation circuit comprising:
        a third MOS transistor of said first conductivity type having both a first current electrode and a control electrode coupled to the second current electrode of said second MOS transistor, and a second current electrode;
        a fourth MOS transistor of said first conductivity type having a first electrode coupled to the second current electrode of said third MOS transistor, and both a control electrode and a second current electrode coupled to said output terminal; and
    shunt means for shunting the drive current away from the base electrode of said NPN bipolar transistor comprising:
        a fifth MOS transistor of said first conductivity type having a first current electrode coupled to the base electrode of said NPN bipolar transistor, a control electrode coupled to said control signal, and a second current electrode coupled to said second supply voltage terminal;
        a sixth MOS transistor of said first conductivity type having a first current electrode coupled to the second current electrode of said second MOS transistor, a control electrode coupled to said control signal, and a second current electrode coupled to said second supply voltage terminal.

8. The output stage of claim 7 wherein said cross-over compensation means further comprise:
    a resistor having a first terminal coupled to the second current electrode of said second MOS transistor and a second terminal coupled to the first current electrode of said third MOS transistor.

* * * * *